(12) United States Patent
Majima et al.

(10) Patent No.: US 7,142,228 B2
(45) Date of Patent: Nov. 28, 2006

(54) THERMAL HEAD AND BONDING CONNECTION METHOD THEREFOR

(75) Inventors: Hidetomi Majima, Niigata-ken (JP); Michiaki Moroe, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 127 days.

(21) Appl. No.: 11/049,904

(22) Filed: Feb. 3, 2005

(65) Prior Publication Data
US 2005/0179730 A1    Aug. 18, 2005

(30) Foreign Application Priority Data
Feb. 18, 2004    (JP) .............................. 2004-042064

(51) Int. Cl.
*B41J 2/335* (2006.01)
(52) U.S. Cl. .................................... 347/208
(58) Field of Classification Search ............. 347/200, 347/201, 202, 205, 208, 209
See application file for complete search history.

(56) References Cited

U.S. PATENT DOCUMENTS 5,781,220 A * 7/1998 Nishizono et al. .......... 347/208

6,326,990 B1 * 12/2001 Imai ........................... 347/208

FOREIGN PATENT DOCUMENTS

JP    08-090811    4/1996

\* cited by examiner

*Primary Examiner*—K. Feggins
(74) *Attorney, Agent, or Firm*—Brinks Hofer Gilson & Lione

(57) ABSTRACT

A thermal head includes a head substrate having a common electrode and individual electrodes connected to exothermic bodies and a driving IC substrate having driving ICs controlling electrification of the individual electrodes and IC electrode pads arranged substantially in parallel with and at a smaller pitch (at most 60 μm) than the exothermic bodies. The individual electrodes and the corresponding IC electrode pads are bonded together with connection wire having a diameter of at most 23 μm. The connection wire includes a connection portion with a width larger than the wire diameter that is connected to the individual electrodes or the IC electrode pads and an upstanding portion raised from the connection portion at a predetermined angle. The surface area of the connection portion is not less than 0.0015 mm² and the sectional area of the upstanding portion is not less than 0.00025 mm².

7 Claims, 10 Drawing Sheets

FIG. 8
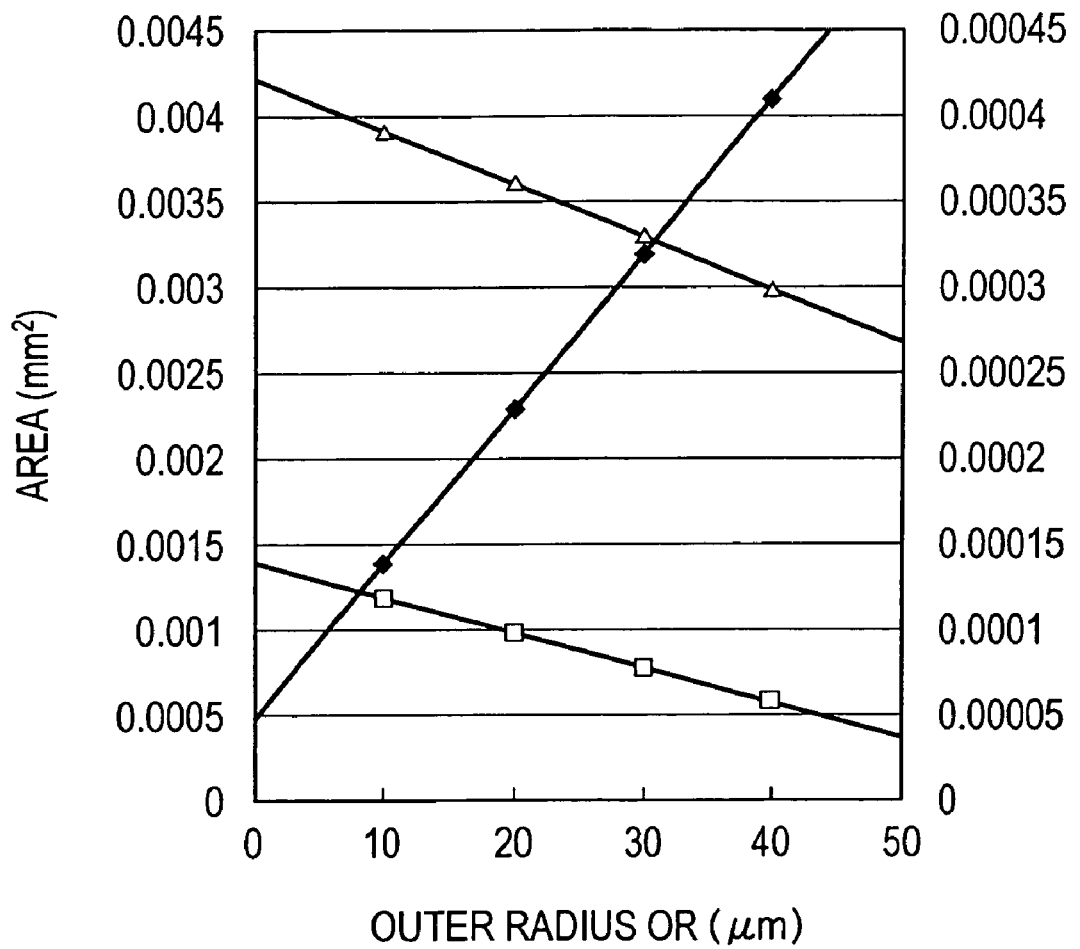
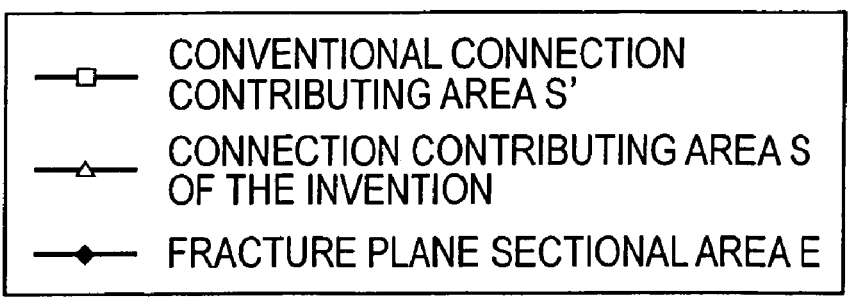

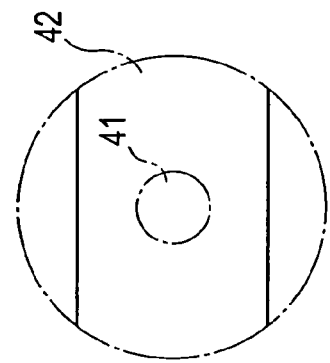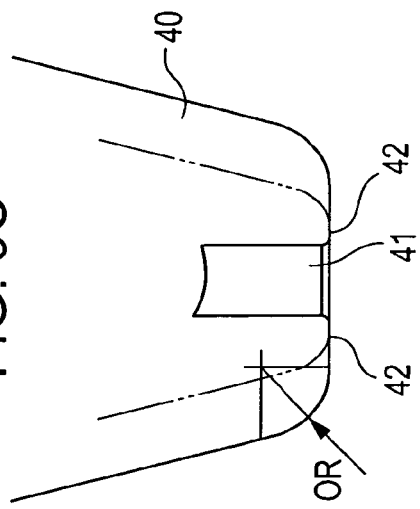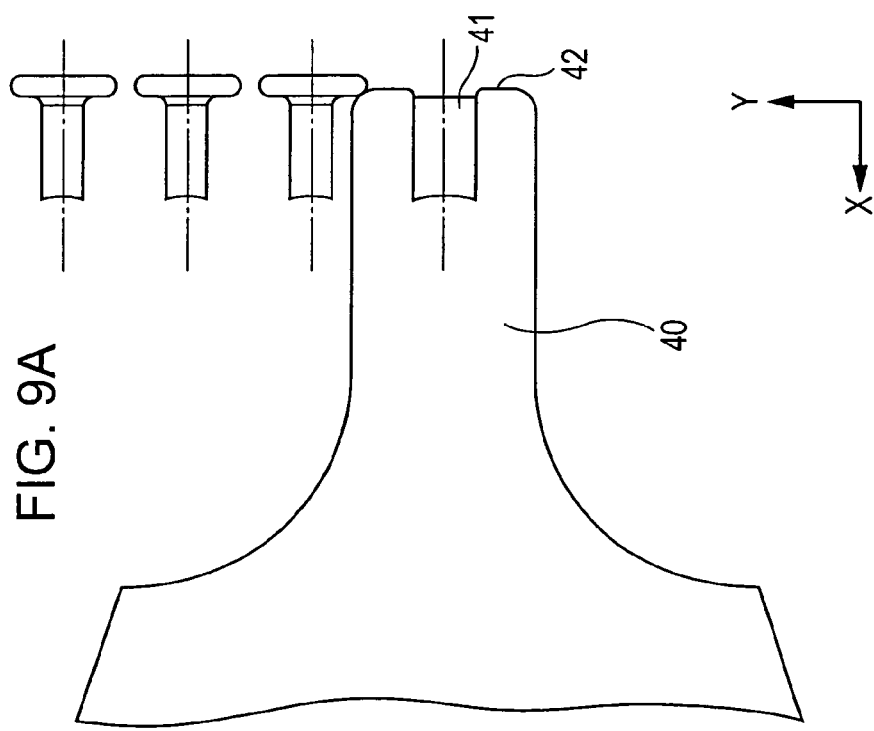

US 7,142,228 B2

THERMAL HEAD AND BONDING CONNECTION METHOD THEREFOR

This application claims the benefit of priority to Japanese Patent Application No. 2004-042064 filed on Feb. 18, 2004, herein incorporated by reference.

BACKGROUND OF THE INVENTION

1. Field of the Invention

The present invention relates to a high-performance thermal head (300 dpi or more) mounted on a thermal transfer printer, for example, and a bonding connection method therefor.

2. Description of the Related Art

The thermal head includes a thermal storage made of a highly insulating material, such as glass, a plurality of exothermic bodies generating heat by turning on electricity, a plurality of individual electrodes individually and electrically connected to the exothermic bodies, a head substrate having a common electrode electrically connected to the entire exothermic bodies, a plurality of driving ICs arranged for each of the individual electrodes and individually controlling electrification/non-electrification of the plurality of individual electrodes, and a driving IC substrate having a plurality of IC-electrode pads to be connected to the individual electrodes corresponding to the plurality of driving ICs, so that a printing material is printed by abutting the exothermic body heated via the common electrode and the individual electrode to the printing material wound around an ink ribbon and a platen roller.

In the thermal head described above, the individual electrode and the corresponding IC-electrode pad can be wire-bonded together with a connection wire. Since the IC-electrode pads are arranged at an interval smaller than that of the exothermic bodies, an AU wire about 25 µm in diameter is used as the connection wire. The connection with the wire bonding generally uses a capillary 40' for bonding a thermal head that, as shown in FIGS. 13A to 13C, includes an insertion hole 41' for inserting a connection wire 31' thereinto and a circular pressure end surface 42' for pressurizing the connection wire 31' inserted into the insertion hole 41'. Specifically, the connection wire 31' and the IC-electrode pad or the individual electrode are connected together by abutting the circular pressure end surface 42' of the capillary and the connection wire 31' together on the IC-electrode pad or the individual electrode so as to apply ultrasonic vibration thereon in this state.

In recent years, the head has been further improved in performance (recording density), so that the number of the exothermic bodies, i.e. the number of printing dots, formed on one head substrate is increased without changing the planar area of the head substrate or with reducing the area. Since the numbers of the individual electrodes and the IC-electrode pads are also increased in association with this, the individual electrodes and the IC-electrode pads are stepwise arranged in a plurality of rows (staggered arrangement). When such a staggered arrangement is adopted on the driving IC substrate, the greater the number of the printing dots is, the area of the substrate (size in width) is also increased, so that the number of the driving IC substrates formed from a single wafer is reduced, which makes it costly. In order to reduce cost by increasing the number of the driving IC substrates formed from one wafer, it is desirable that the pitch of the IC-electrode pads be reduced as small as possible so that a plurality of the IC-electrode pads be arranged in a row substantially in parallel with the arranging direction of the exothermic bodies. Similarly, it is also preferable that the pitch of the individual electrodes be decreased as small as possible.

However, when the pitches of the individual electrodes and the IC-electrode pads are reduced, the wire diameter of the capillary used in bonding the connection is restricted, so that the connection area of the connection wire, to which the individual electrode and the IC-electrode pad are bonded with the capillary, becomes smaller. The individual electrode and the IC-electrode pad are made of Al and formed on a hard ceramic substrate or glass. In order to directly bond the connection wire on this Al, an alloy of Al and Au (eutectic phase made by the thermal diffusion of Al) must be sufficiently developed by breaking an oxide film on the surface of Al. Hence, if the connection surface area to the connection wire is not sufficiently ensured, the connection strength is not sufficiently obtained, so that the specific electric resistance fluctuates due to unstable contact and the reliability is reduced (the presence of breaking of wire). For increasing the connection surface area, the energy required for forming the alloy of Al and Au may be increased by increasing the force pressurizing the connection wire. However, if the force pressurizing the connection wire is increased, an upstanding portion of the connection wire is reduced in thickness (sectional area), so that the tensile strength is decreased. In such a manner, the relationship between increase in the connection surface area of the connection wire and that in thickness of the upstanding portion of the connection wire is incompatible, so that both the increases are difficult to be simultaneously satisfied.

SUMMARY OF THE INVENTION

The present invention has been made in view of the problems described above, and it is an object thereof to obtain an inexpensive and high-performance thermal head capable of securely bonding-connecting between an individual electrode and an IC-electrode pad even with their small pitches and a bonding-connection method therefor.

According to the present invention, by paying attention to a connection shape between a connection wire and an individual electrode/an IC electrode pad (lead wedge shape), conditions of the lead wedge shape are defined for obtaining an ideal connection state and the lead wedge shape is formed with a capillary.

That is, a thermal head according to the present invention includes a head substrate having a plurality of exothermic bodies arranged at a predetermined interval, a common electrode connected to the entire plurality of exothermic bodies, and a plurality of individual electrodes individually connected to the plurality of exothermic bodies; and a driving IC substrate having a plurality of driving ICs individually controlling electrification/non-electrification of the plurality of individual electrodes and a plurality of IC electrode pads arranged substantially in parallel with the arranging direction of the exothermic bodies at a pitch smaller than the arranging interval of the exothermic bodies and respectively connected to the plurality of driving ICs, so that the plurality of individual electrodes and the plurality of IC electrode pads are bonded together with connection wire, wherein the connection wire is at most 23 µm in diameter and includes a connection portion with a width larger than the wire diameter and connected to the individual electrodes or the IC electrode pads and an upstanding portion raised from the connection portion at a predetermined angle in a state floated from the individual electrodes or the IC electrode pads, and wherein the pitch of the IC electrode pads is at most 60 µm; the surface area of the connection portion of the connection wire is not less than 0.0015 mm$^2$; and the sectional area of the upstanding portion of the connection wire is not less than 0.00025 mm$^2$.

Practically, the connection wire may be made of Au, and at least one of the plurality of individual electrodes and the plurality of IC electrode pads may be made of Al.

In a thermal head including a head substrate having a plurality of exothermic bodies arranged at a predetermined interval, a common electrode connected to the entire plurality of exothermic bodies, and a plurality of individual electrodes individually connected to the plurality of exothermic bodies and a driving IC substrate having a plurality of driving ICs individually controlling electrification/non-electrification of the plurality of individual electrodes; and a plurality of IC electrode pads arranged substantially in parallel with the arranging direction of the exothermic bodies at a pitch of at most 60 µm which is smaller than the arranging interval of the exothermic bodies and respectively connected to the plurality of driving ICs, a bonding connection method of the thermal head according to the present invention includes the steps of preparing connection wire with a diameter of 23 µm or less; and bonding the individual electrodes on the IC electrode pads with the connection wire, wherein the surface area of a connection portion between the connection wire and the individual electrodes/the IC electrode pads is not less than 0.0015 mm$^2$ and the sectional area of an upstanding portion of the connection wire raised from the connection portion is not less than 0.00025 mm$^2$.

In the bonding connection method described above, in order to have a surface area of not less than 0.0015 mm$^2$ in the connection portion between the connection wire and the individual electrodes/the IC electrode pads and to have a sectional area of not less than 0.00025 mm$^2$ in an upstanding portion of the connection wire raised from the connection portion, there are following three embodiments.

According to a first embodiment, a bonding connection method includes the steps of preparing a capillary including an insertion hole for inserting the connection wire thereinto and a pressure end surface for pressing the connection wire inserted into the insertion hole, wherein the planar shape of the pressure end surface being non-circular in that the length in the arranging direction of the individual electrodes or the IC-electrode pads is shorter than that in a direction perpendicular thereto; and bonding the connection wire to the individual electrodes or the IC-electrode pads by pressing the connection wire inserted into the insertion hole of the capillary and placed on the individual electrodes or the IC-electrode pads with the pressure end surface while ultrasonic vibration being applied to the pressed connection wire. According to the embodiment, both respective ends of the pressure end surface in a direction perpendicular to the arranging direction of the exothermic bodies may have a curved surface with a curvature ranging from 0.03 mm to 0.05 mm.

According to a second embodiment, a bonding connection method includes the steps of preparing a capillary having an insertion hole for inserting the connection wire thereinto and a pressure end surface for pressing the connection wire inserted into the insertion hole; and bonding the connection wire to the individual electrodes or the IC-electrode pads by pressing the connection wire inserted into the insertion hole of the capillary and placed on the individual electrodes or the IC-electrode pads with the pressure end surface so as to move the capillary in a direction perpendicular to the arranging direction of the individual electrodes or the IC-electrode pads while ultrasonic vibration being applied to the pressed connection wire.

According to a third embodiment, a bonding connection method includes the steps of forming an Au pad layer with a surface area of not less than 0.002 mm$^2$ on the individual electrodes or the IC-electrode pads; and bonding one end of the connection wire on the Au pad layer.

According to the present invention, an inexpensive and high-performance thermal head capable of securely bonding-connecting between an individual electrode and an IC-electrode pad even with their small pitches and a bonding-connection method therefor can be obtained.

BRIEF DESCRIPTION OF THE DRAWINGS

FIGS. 5A and 5B show a connection shape of an Au connection wire bonded by a method according to the present invention, wherein FIG. 5A is a plan view and FIG. 5B is a sectional view;

FIG. 8 is a graph showing the relationship between the fracture plane sectional area E, the connection contributing area S according to the present invention, the connection contributing area S' according to a conventional mode, and the curvature OR of both ends of a pressure end surface of a capillary, when the fracture plane sectional area E according to the embodiment of the invention is the same as that of the conventional mode;

FIGS. 9A to 9C are drawings of the capillary, wherein FIG. 9A is a side view of the capillary, FIG. 9B is a plan view of the pressure end surface, and FIG. 9C is a sectional view showing the vicinity of the pressure end surface;

FIGS. 10A and 10B are drawings illustrating a bonding connection method according to a first embodiment, wherein FIG. 10A is a perspective sectional view and FIG. 10B is a sectional view;

FIGS. 13A to 13C are drawings of a conventional capillary, wherein FIG. 13A is a plan view of the capillary, FIG. 13B is a plan view of a pressure end surface, and FIG. 13C is a sectional view showing the vicinity of the pressure end surface.

DESCRIPTION OF THE PREFERRED EMBODIMENTS

Figure 1:
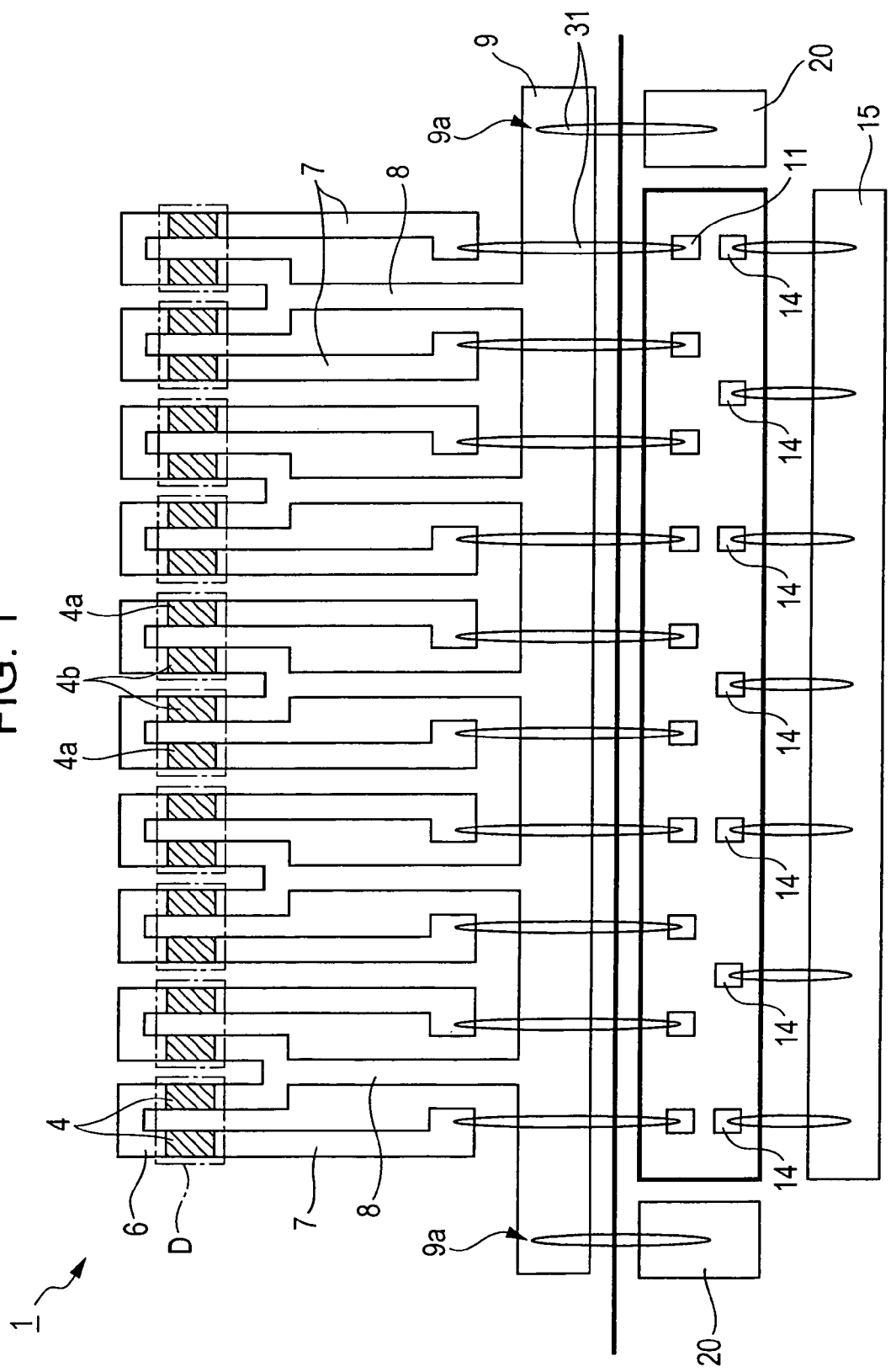
FIG. 1 is a plan view of a thermal head according to an embodiment of the present invention.
Figure 2:
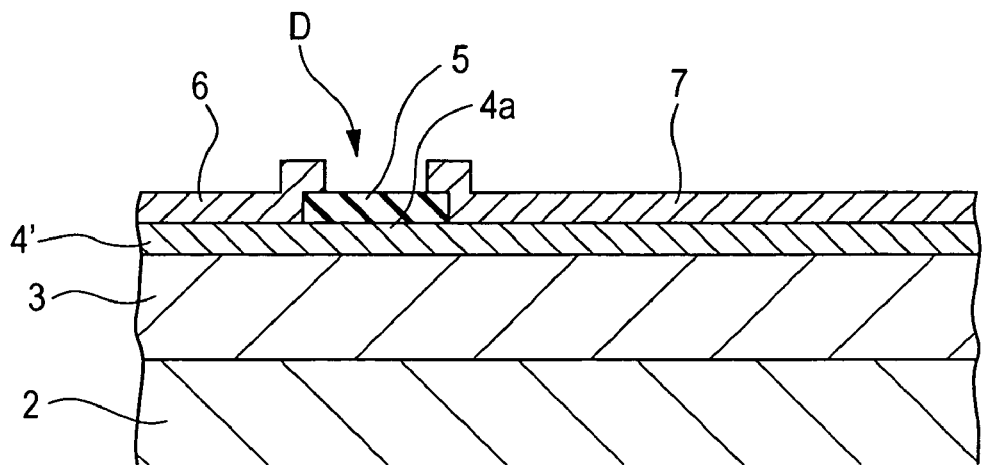
FIG. 2 is a sectional view of the thermal head showing the side of an individual electrode.
Figure 3:
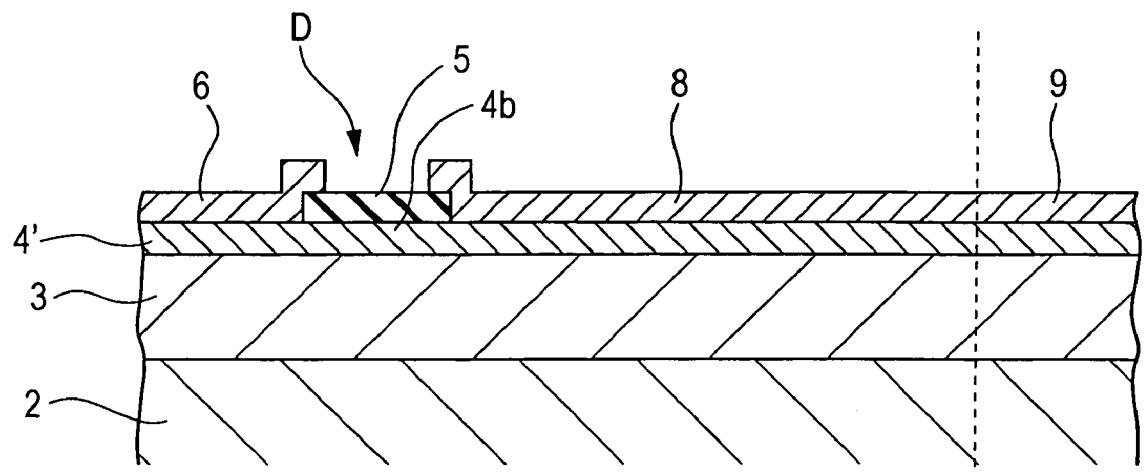
FIG. 3 is a sectional view of the thermal head showing the side of a common electrode.

FIGS. 1 to 3 show a thermal head 1 incorporating the present invention. The thermal head 1 includes a thermal storage layer 3 made of a heat-insulating material, such as glass, and formed on a head substrate 2 that is made of a ceramic material or a metallic material and defuses heat efficiently, and a plurality of exothermic bodies 4 arranged on the thermal storage layer 3 in the longitudinal direction of FIG. 1 at predetermined intervals. The exothermic body 4 is part of a resistor layer 4' formed on the entire thermal storage layer 3 using a cermet material, such as $Ta_2N$ or $Ta$—$SiO_2$, and the surface of the resistor layer 4' is covered with an insulating barrier layer 5. The insulating barrier layer 5 is formed of an insulating material, such as $SiO_2$, SiON, and SiAlON, and defines a planar size (length L and width W) of the exothermic body 4. Between the exothermic bodies 4 adjacent to each other, a gap region α exists where the head substrate 2 is exposed. According to the embodiment, a couple of the exothermic bodies 4 (4a and 4b) adjacent to each other form one printing dot D, and a plurality of the printing dots D are arranged in a row in a direction (longitudinal direction of FIG. 1) perpendicular to the electrification direction of the exothermic bodies 4.

The couple of the exothermic bodies 4a and 4b are connected together with a conductor 6 horseshoe-shaped in plan view at each one end in the longitudinal direction. The other end of the exothermic body 4a, as shown in FIG. 2, is connected to an individual electrode 7, and the other end of the exothermic body 4b, as shown in FIG. 3, is connected to a common electrode 8. The individual electrode 7 and the common electrode 8 are connected to the printing dots D in the same direction, and are aligned maintaining a specific regularity to the arranging direction of the printing dots D (the exothermic bodies 4). Between the individual electrode 7 and the common electrode 8, a gap region α exists, which defines the widths of the individual electrode 7 and the common electrode 8 to be substantially the same as the width W of the exothermic body 4.

The individual electrode 7 is provided for each of the printing dots D so as to lengthwise extend in the longitudinal direction of the exothermic body 4a. The individual electrode 7, made of Al, is wire-bonded to an IC-electrode pad 11 of a driving unit 10 at an end opposite to the exothermic body 4a.

The common electrode 8 is provided every two printing dots D adjacent to each other, and is arranged between the individual electrodes 7 provided in the two printing dots D. The common electrode 8 is formed in a substantial Y-shape including a horseshoe section connected to two exothermic bodies 4a adjacent to each other and a straight section stepwise extending from the horseshoe section in parallel with the longitudinal direction of the exothermic body 4a. Each common electrode 8 is connected to a common line 9 at an end opposite to the exothermic body 4b. The common line 9 extends in the arranging direction of a plurality of the printing dots D (or a plurality of the exothermic bodies 4), and power is sent to a pair of feeding points 9a provided on both sides of the common line 9 in the longitudinal direction (longitudinal direction of FIG. 1). A pair of the feeding points 9a are respectively connected to a power supply 20 outside the head substrate 2. The electric power from the common line 9 is fed to the entire printing dots D via each common electrode 8. In the conductor 6, the individual electrode 7, and the common electrode 8 according to the embodiment, each end adjacent to the exothermic body 4 is overlaid on the insulating barrier layer 5. The conductor 6, the common electrode 8, and the common line 9 are made of a conductive material such as Cr, Ti, Ni, and W.

Although not shown, on the insulating barrier layer 5, the conductor 6, the individual electrode 7, the common electrode 8, and the common line 9, wear-resistance protection layers are formed for protecting them against the contact to platen rollers.

Figure 4:
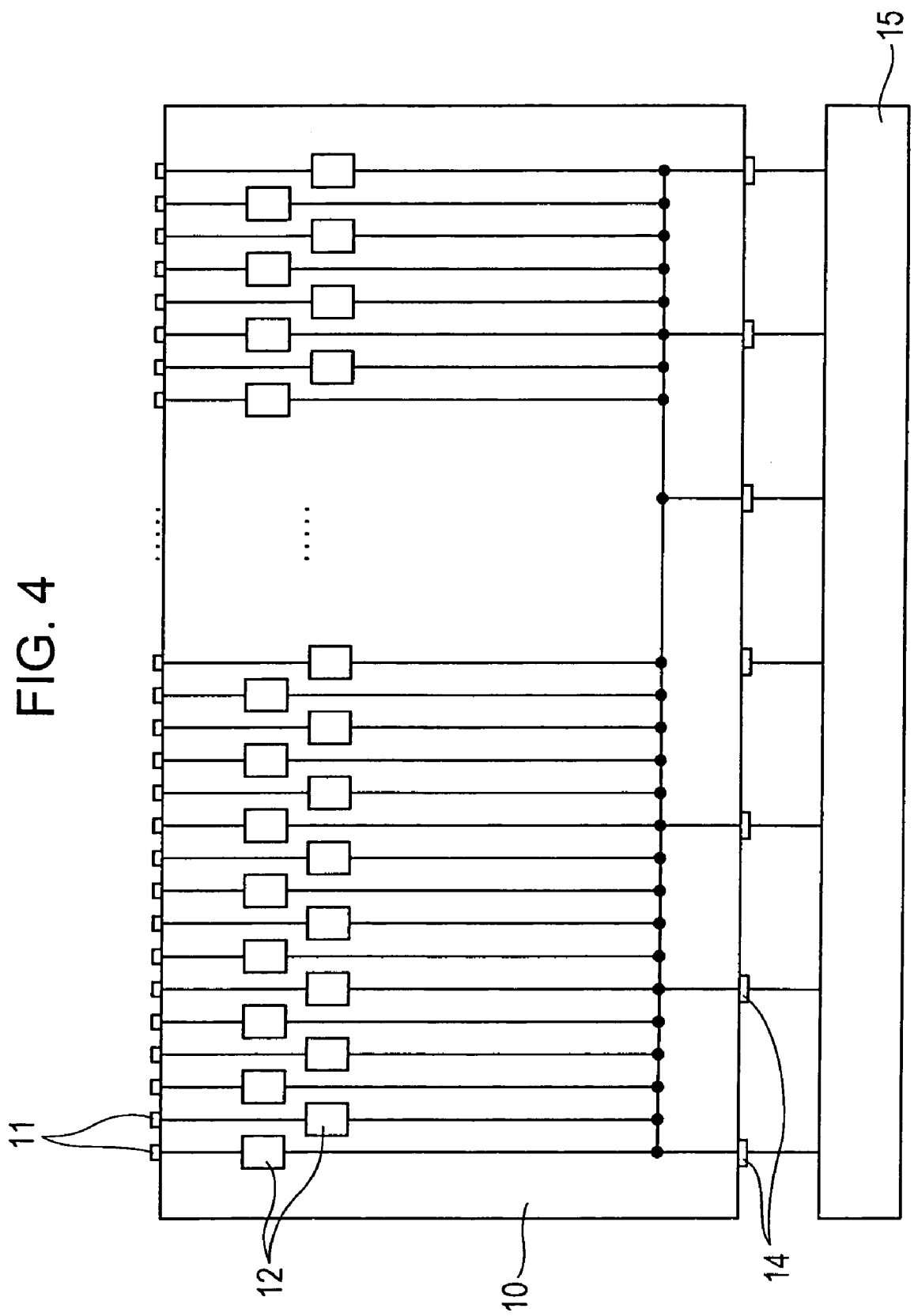
FIG. 4 is a block diagram schematically showing the configuration of a driving unit.

The driving IC substrate 10 is provided separately from the head substrate 2, and as shown in FIG. 4, includes a plurality of driving Ics 12 for individually controlling electrification/non-electrification of a plurality of the individual electrodes 7, a plurality of IC-electrode pads 11 connected to the individual plurality of driving Ics 12, and a plurality of external connection terminals 14 connected to ground terminals of the respective driving Ics 12. The plurality of external connection terminals 14 are connected to ground pads 15 different from the driving IC substrate 10 and the head substrate 2, so that the ground voltage from the ground pads 15 is applied to the respective driving Ics 12 via the IC-electrode pads 11 and the individual electrodes 7. The plurality of external connection terminals 14 are electrically connected together.

The IC-electrode pads 11 are arranged substantially in parallel with the arranging direction of the exothermic bodies 4 (the longitudinal direction of FIG. 1) at a pitch smaller than the arrangement interval of the exothermic bodies 4. It is preferable that the pitch of the IC-electrode pads 11 be 60 µm or less for achieving a high performance of 300 dpi or more, so that the pitch of the IC-electrode pads 11 according to the embodiment is 58 µm. Although shown enlarged simply in FIG. 1 for drawing convenience sake, the IC-electrode pads 11 are arranged at the small pitch in practice. The IC-electrode pad 11 is wire-bonded to the corresponding individual electrode 7 with an Au connection wire 31.

The thermal head configured as described above features the wire bonding connection between the individual electrode 7 and the IC-electrode pad 11. The connection shape (lead wedge shape) of the Au connection wire 31 will be described below with reference to FIGS. 5A and 5B. Since the connection shape of the Au connection wire 31 when it is bonded to the individual electrode 7 is the same as that when it is bonded to the IC-electrode pads 11, the case where the IC-electrode pad 11 is bonded thereto will be described.

Figure 5A:
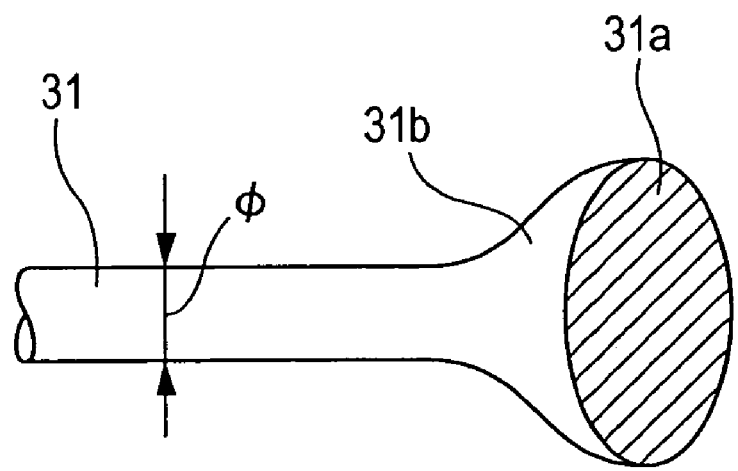
Figure 5B:
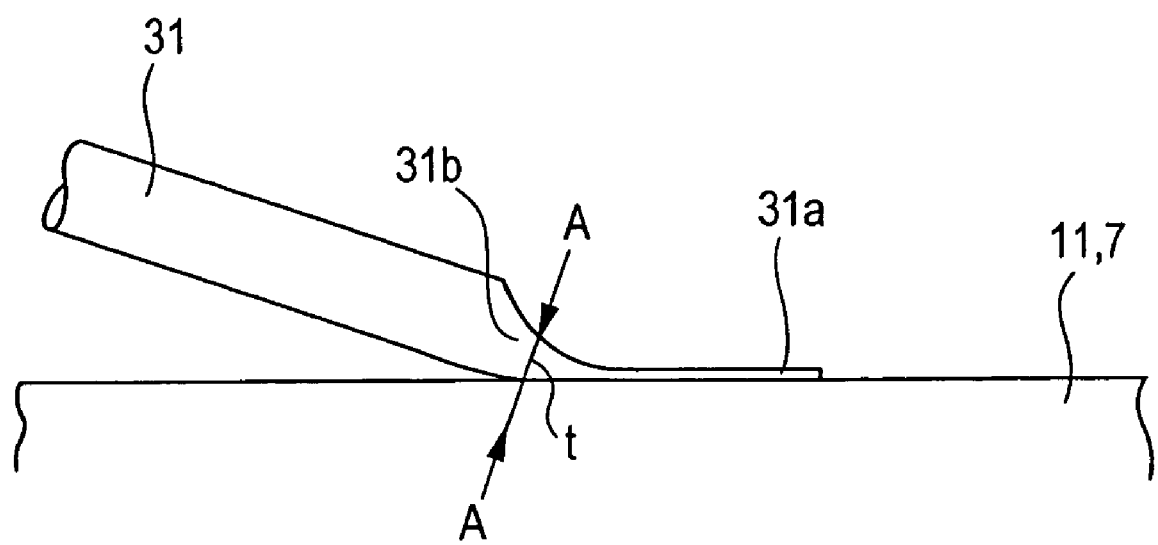

The Au connection wire 31 has a wire diameter φ of 23 µm or less. The wire diameter φ of the Au connection wire 31 is restricted by the pitches of the IC-electrode pads 11 and the individual electrodes 7, and by satisfying the above range, the Au connection wire 31 can be preferably bonded to both the IC-electrode pads 11 and the individual electrodes 7 without protruding outside them. The Au connection wire 31 boned to the IC-electrode pad 11, as shown in FIGS. 5A and 5B, includes a connection portion 31a with a width larger than the wire diameter φ (a hatched region in FIGS. 5A and 5B) and an upstanding portion 31b raised from the connection portion 31a at a predetermined angle. The connection portion 31a is formed by receiving the pressure and ultrasonic vibration from a capillary 40 (FIGS. 9A to 9C) during bonding connection, and is bonded to the IC-electrode pad 11 by the thermal diffusion of Al constituting the IC-electrode pad 11 via an alloy layer (eutectic layer between Au and Al) formed on the interface between the Au connection wire 31 and the IC-electrode pad 11. In other words, during the bonding connection, a region where the alloy layer is formed between the Au connection wire 31 and the IC-electrode pad 11 becomes the connection portion 31a, and the larger the surface area of the connection portion 31a is, the connection strength of the Au connection wire 31 increases. The upstanding portion 31b is not bonded to the IC-electrode pad 11 maintaining a state floated from the IC-electrode pad 11 by a minute distance t. The larger the thickness of the upstanding portion 31b, i.e., the sectional area at the line A—A of FIG. 5B, becomes, the tensile strength of the Au connection wire 31 increases.

Figure 6:
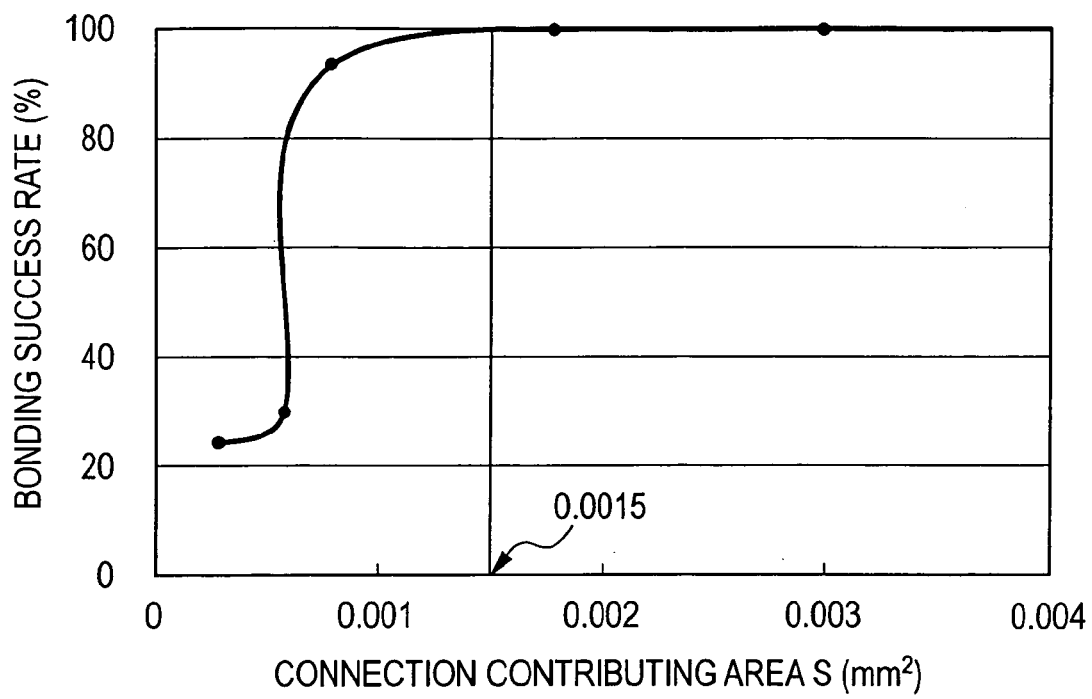
FIG. 6 is a graph showing the relationship between the connection contributing area S (mm$^2$) of the Au connection wire and the bonding success rate (%)

FIG. 6 is a graph showing the relationship between the connection contributing area S (mm$^2$) of the Au connection wire 31 and the bonding success rate (%). The connection contributing area S of the Au connection wire 31 herein means the surface area of the Au connection wire 31. Referring to FIG. 6, when the connection contributing area S is about 0.0003 mm$^2$, the bonding success rate is small 20%, and as the connection contributing area S approaches 0.001 mm$^2$, the bonding success rate rapidly increases. Then, the connection contributing area S becomes over 0.0015 mm$^2$, the bonding success rate comes to 100%. It is thereby understood that if the connection contributing area S is not less than 0.0015 mm$^2$ or more, the Au connection wire 31 can be securely wire-bonded, so that the electrical resistance of the bonding connection portion is stabilized.

Figure 7:
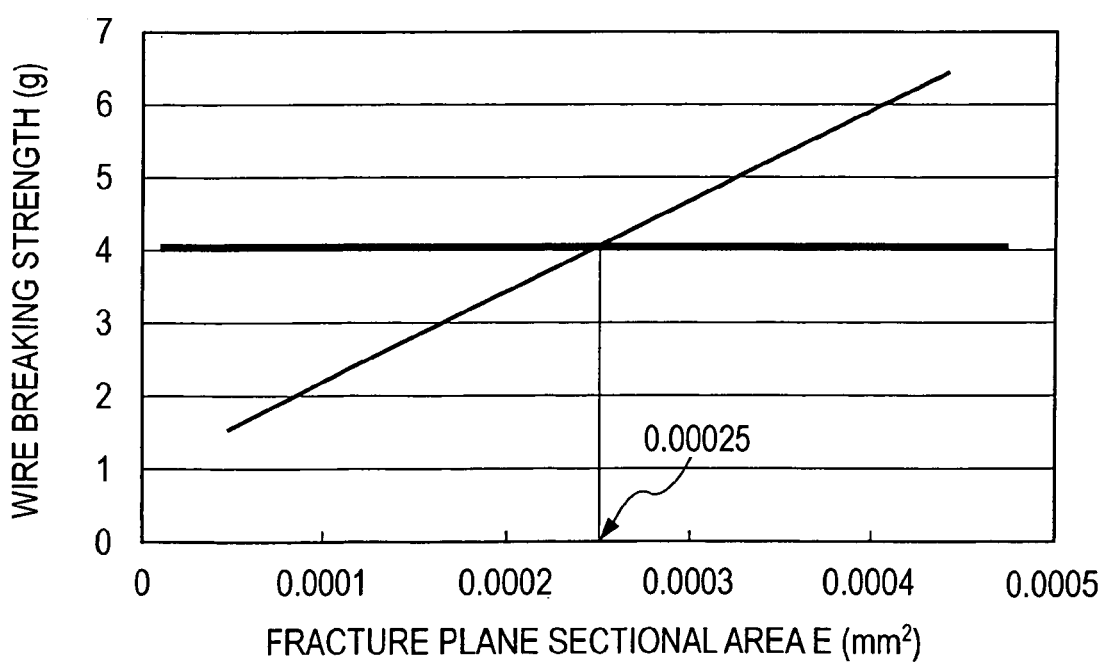
FIG. 7 is a graph showing the relationship between the fracture plane sectional area E (mm$^2$) of the Au connection wire and the wire strength (g)

FIG. 7 is a graph showing the relationship between the fracture plane sectional area E (mm$^2$) of the Au connection wire 31 and the wire strength (g). The fracture plane sectional area of the Au connection wire 31 herein means the fracture plane sectional area produced by applying a predetermined tension thereto so as to break the Au connection wire 31, and is substantially the same as the sectional area of the upstanding portion 31b. The present thermal head is required to have the 4 g wire strength or more, and this lower limit is shown by the bold line of FIG. 7. Referring to FIG. 7, the fracture plane sectional area E of the Au connection wire 31 has the relationship proportional to the wire strength, so that with increasing the fracture plane sectional area E, the wire strength also increases. It is when the fracture plane sectional area E is about 0.00025 mm$^2$ to come to a minimum strength of 4 g, which is required for the wire. Accordingly, it is understood that if the sectional area of the upstanding portion 31b of the Au connection wire 31 is not less than 0.00025 mm$^2$, the tensile strength and reliability of the Au connection wire 31 can be ensured.

As is apparent from FIGS. 6 and 7 described above, for securely bonding the Au connection wire 31 having a wire diameter φ of 23 µm or less, the following conditions must be satisfied:

(Condition 1) $S \geq 0.0015$ mm$^2$ (Condition 2) $E \geq 0.00025$ mm$^2$.

When the above conditions 1 and 2 are satisfied, even at a small pitch of 60 µm or less, the individual electrode can be securely bonded to the IC-electrode pad.

FIGS. 9A to 9C show the capillary 40 used during bonding connection. The capillary 40 includes an insertion hole 41 for inserting the Au connection wire 31 thereinto and a pressure end surface 42 for pressurizing the Au connection wire 31 inserted into the insertion hole 41. The insertion hole 41 is positioned at the center of the pressure end surface 42, and the Au connection wire 31 inserted into the insertion hole 41 protrudes from the center of the pressure end surface 42. The pressure end surface 42 has a non-circular shape in which the length in the arranging direction of the individual electrodes 7 and the IC-electrode pads 11 (Y-direction in the drawings) is shorter than that in a direction perpendicular thereto (X-direction in the drawings), and both ends in the X-direction are curved. Both the curved ends of the pressure end surface 42 have curved surfaces with a predetermined curvature OR. With increasing curvature OR, both the ends are largely curved, so that an effective region pushing the Au connection wire 31 in reality decreases in the pressure end surface 42. Hence, as shown in FIG. 8, although the surface area of the connection portion 31a decreases, the sectional area (thickness) of the upstanding portion 31b increases. In such a manner, the curvature OR of both ends of the pressure end surface 42 is a parameter defining the surface area of the connection portion 31a and the sectional area (thickness) of the upstanding portion 31b. The curvature OR is optimized so as to satisfy the conditions 1 and 2 of the bonding connection described above, and according to the embodiment, as is apparent from FIG. 8, the curvature OR is 0.03 mm or more. The curvature OR may be more preferably between 0.003 mm and 0.05 mm, and further preferably between 0.003 mm and 0.04 mm. Within such a range of the curvature OR, both the surface area of the connection portion 31a and the sectional area of the upstanding portion 31b can be optimized. In addition, the planar shape of the pressure end surface 42 is not limited to a substantial ellipse but it may be rectangular, rhombic, and oval.

Then, a bonding connection method according to a first embodiment for satisfying the above bonding conditions 1 and 2 will be described.

First, the Au connection wire 31 having a wire diameter of 23 µm or less, the insertion hole 41 shown in FIGS. 9A to 9C, and the capillary 40 having the non-circular pressure end surface 42 are prepared. Then, the Au connection wire 31 is inserted into the insertion hole 41 of the capillary 40 so as to protrude from the center of the pressure end surface 42. In this state, the Au connection wire 31 is supported by the capillary 40.

Figure 10A:
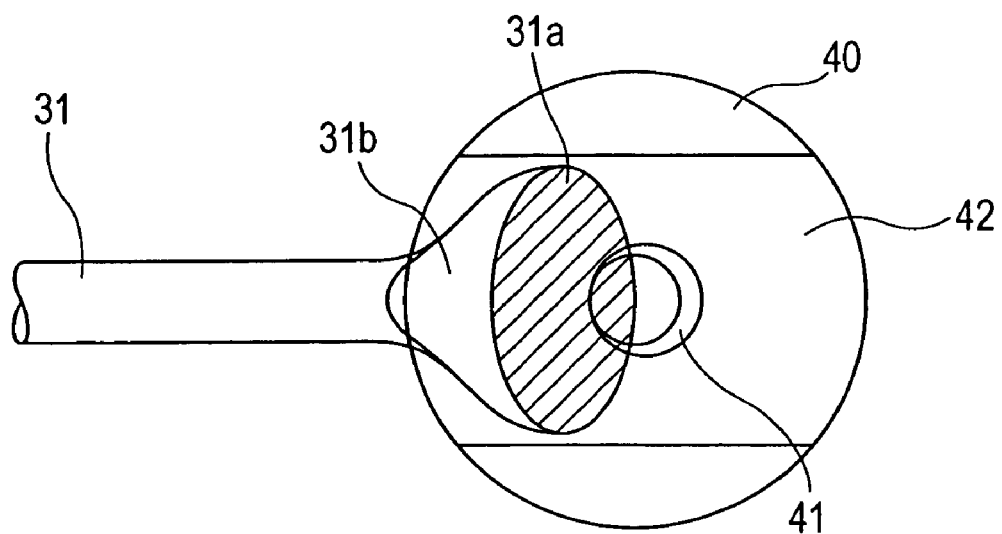
Figure 10B:
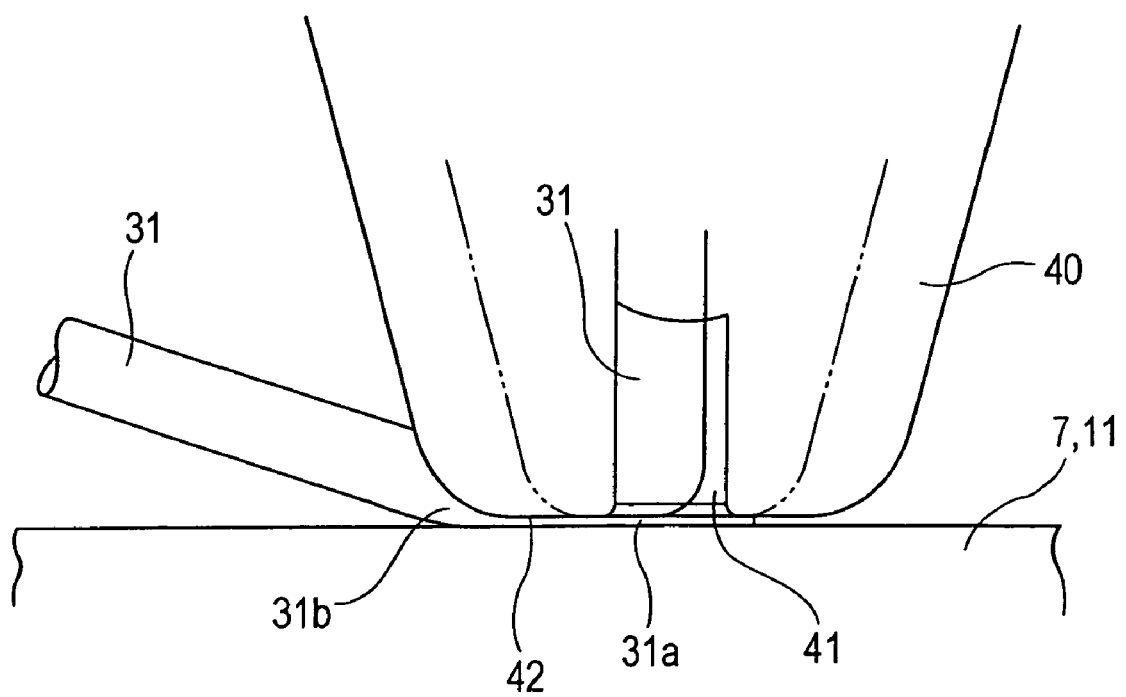

Subsequently, as shown in FIGS. 10A and 10B, the Au connection wire 31 is placed on the individual electrode 7 or the IC-electrode pad 11, and is pressed thereon with the pressure end surface 42 from the above. In this pressed state, ultrasonic vibration is applied to the Au connection wire 31 from the capillary 40. By the ultrasonic vibration, an oxide film made of Al on the surface of the individual electrode 7 or the IC-electrode pad 11 is broken so as to form an alloy of Au and Al on the interface between the Au connection wire 31 and the individual electrode 7 or the IC-electrode pad 11. That is, the Au connection wire 31 is connected to the individual electrode 7 or the IC-electrode pad 11 so as to form the connection portion 31a (hatched portions of FIGS. 10A and 10B) and the upstanding portion 31b depending on the planar shape and the curvature OR of both ends of the pressure end surface 42 of the capillary 40. As described above, since the planar shape and the curvature OR are optimized to satisfy the bonding conditions 1 and 2, the surface area of the connection portion 31a and the thickness (sectional area) of the upstanding portion 31b are sufficiently ensured so as to have enough connection strength.

Figure 13B:
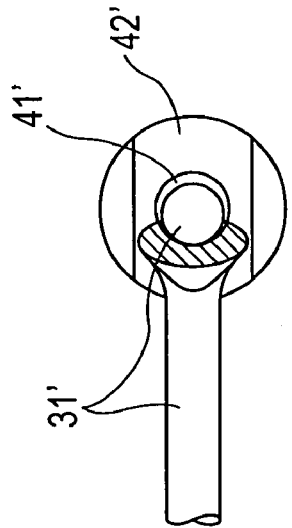
Figure 13C:
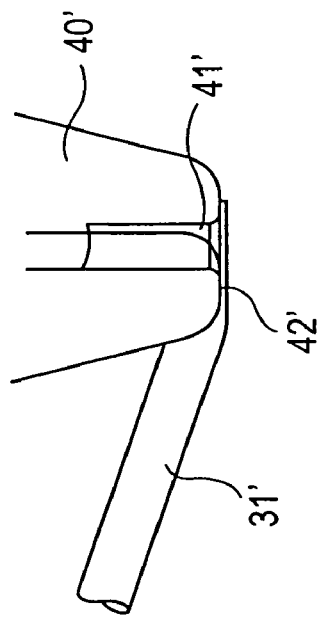
Figure 13A:
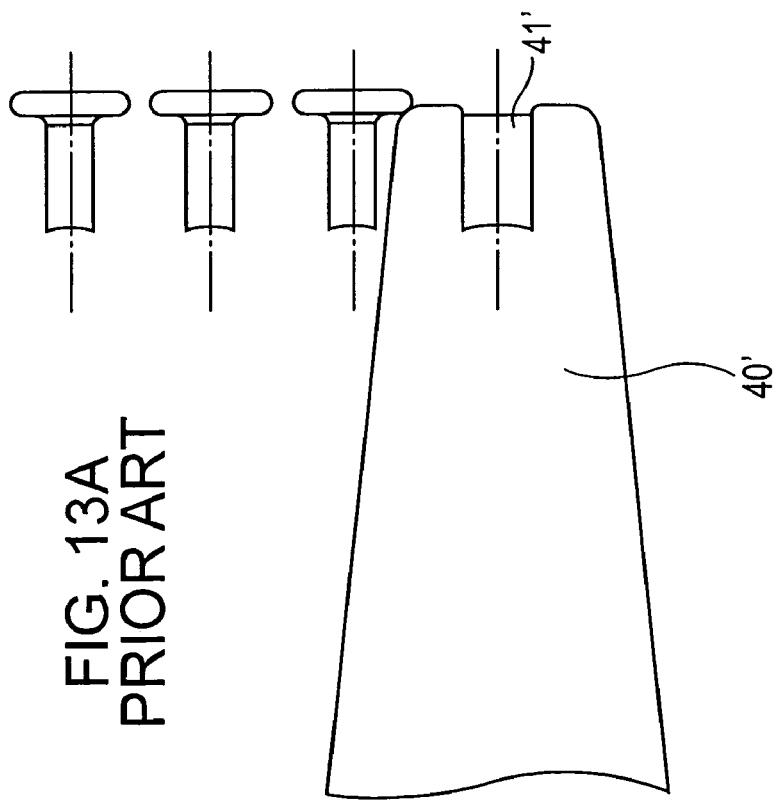

FIG. 8, with rectangular indexes, shows the relationship between the connection contributing area S'/the fracture plane sectional area E and the curvature OR of the capillary 40' in a conventional mode of bonding the Au connection wire 31 using the capillary 40' shown in FIG. 13. When the fracture plane sectional area E according to the embodiment is the same as that of the conventional mode, the connection contributing area S' of the conventional mode is smaller than the connection contributing area S according to the embodiment to a large extent, so that the bonding condition 1 cannot be satisfied when the fracture plane sectional area E is asked to have 0.00025 mm$^2$ or more.

In the first embodiment described above, the connection shape of the Au connection wire 31 is formed depending on the planar shape and the curvature OR of both ends of the pressure end surface 42 of the capillary 40. Next, a bonding connection method according to a second embodiment different from the first embodiment will be described.

Figure 11:
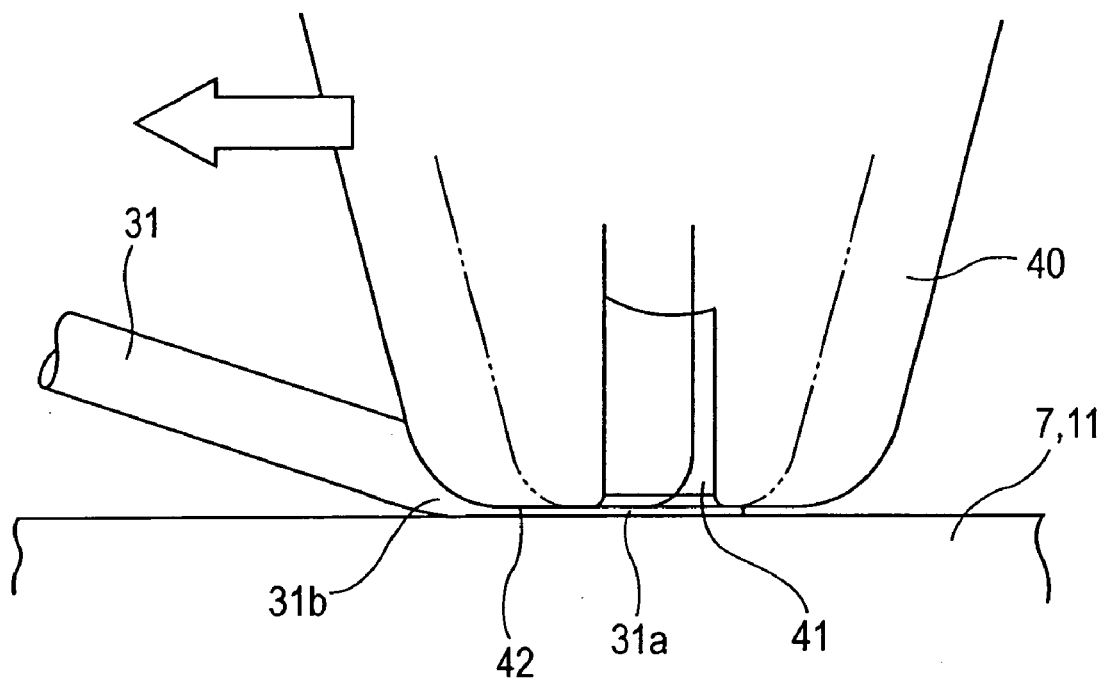
FIG. 11 is a sectional view illustrating a bonding connection method according to a second embodiment.

According to the second embodiment, the planar shape and the curvature OR of both ends of the pressure end surface 42 of the capillary 40 are no object. As shown in FIG. 11, while ultrasonic vibration being applied to the Au connection wire 31 pressed with the pressure end surface 42, the capillary 40 is moved in the arrow direction in the drawing (direction perpendicular to the arranging direction of the individual electrodes 7 and the IC-electrode pads 11) so as to connect the Au connection wire 31. When the capillary 40 is moved in the arrow direction in such a manner, the surface area of the connection portion 31a of the Au connection wire 31 can be expanded in the direction perpendicular to the arrow in the drawing, so that the surface area of the connection portion 31a can be increased while the sectional area of the upstanding portion 31b being maintained.

Figure 12:
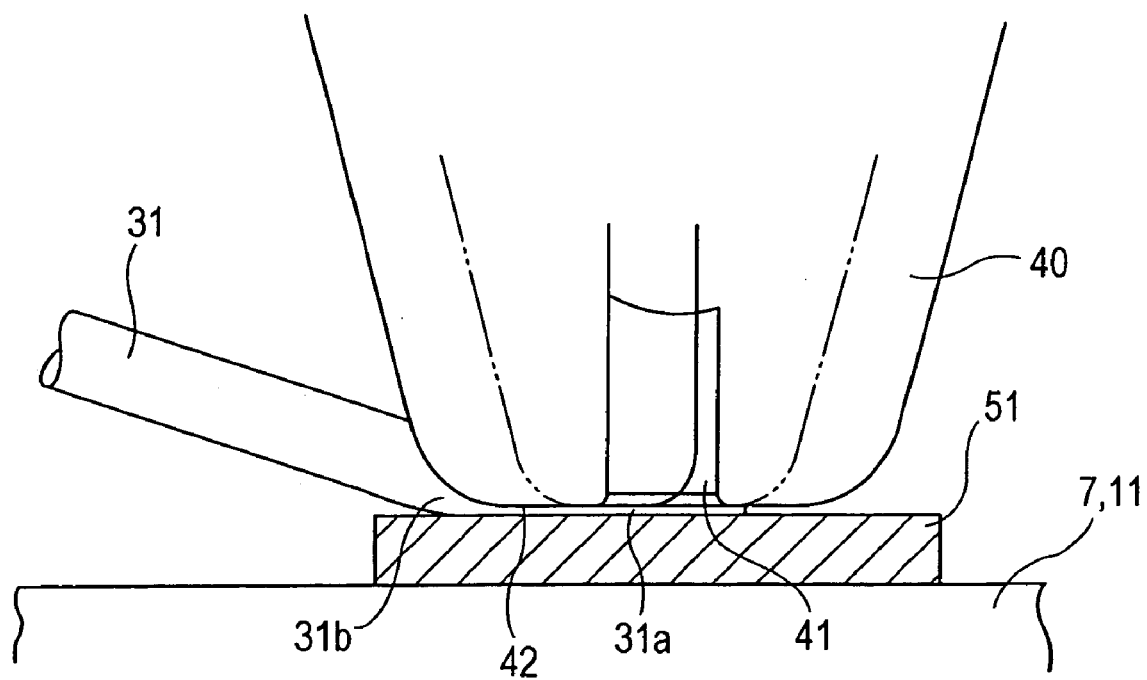
FIG. 12 is a sectional view illustrating a bonding connection method according to a third embodiment.

Furthermore, as another embodiment, as shown in FIG. 12, on the individual electrode 7 and the IC-electrode pad 11, an Au pad 51 is formed in advance with a surface area satisfying the bonding condition 1 so as to bond the Au connection wire 31 on the Au pad 51. In this embodiment, the planar shape and the curvature OR of both ends of the pressure end surface 42 of the capillary 40 are also no objects. According to the embodiment, the contact area is sufficiently ensured with the Au pad 51, so that the Au connection wire 31 may be connected so as to make the sectional area (thickness) of the upstanding portion 31b of the Au connection wire 31 satisfy the condition 2.

According to the embodiments described above, the present invention incorporates a common-turn up thermal head in which the individual electrode 7 and the common electrode 8 are arranged in the same direction; however, the invention may also be applied to a general thermal head in that the individual electrode 7 and the common electrode 8 are aligned in a straight line.

What is claimed is:

1. A thermal head comprising:
   a head substrate comprising a plurality of exothermic bodies arranged at a predetermined interval, a common electrode connected to the entire plurality of exothermic bodies, and a plurality of individual electrodes individually connected to the plurality of exothermic bodies; and
   a driving IC substrate comprising a plurality of driving ICs individually controlling electrification/non-electrification of the plurality of individual electrodes and a plurality of IC electrode pads arranged substantially in parallel with the arranging direction of the exothermic bodies at a pitch smaller than the arranging interval of the exothermic bodies and respectively connected to the plurality of driving ICs, so that the plurality of individual electrodes and the plurality of IC electrode pads are bonded together with connection wire,
   wherein the connection wire is at most 23 μm in diameter and includes a connection portion with a width larger than the wire diameter and connected to the individual electrodes or the IC electrode pads and an upstanding portion raised from the connection portion at a predetermined angle in a state floated from the individual electrodes or the IC electrode pads, and
   wherein the pitch of the IC electrode pads is at most 60 μm; the surface area of the connection portion of the connection wire is not less than 0.0015 mm$^2$; and the sectional area of the upstanding portion of the connection wire is not less than 0.00025 mm$^2$.

2. The thermal head according to claim 1, wherein the connection wire is made of Au, and at least one of the plurality of individual electrodes and the plurality of IC electrode pads is made of Al.

3. A bonding connection method of a thermal head that comprises a head substrate comprising a plurality of exothermic bodies arranged at a predetermined interval, a common electrode connected to the entire plurality of exothermic bodies, and a plurality of individual electrodes individually connected to the plurality of exothermic bodies and a driving IC substrate comprising a plurality of driving ICs individually controlling electrification/non-electrification of the plurality of individual electrodes; and a plurality of IC electrode pads arranged substantially in parallel with the arranging direction of the exothermic bodies at a pitch of at most 60 μm which is smaller than the arranging interval of the exothermic bodies and respectively connected to the plurality of driving ICs, the method comprising the steps of:
   preparing connection wire with a diameter of 23 μm or less; and
   bonding the individual electrodes on the IC electrode pads with the connection wire,
   wherein the surface area of a connection portion between the connection wire and the individual electrodes/the IC electrode pads is not less than 0.0015 mm$^2$ and the sectional area of an upstanding portion of the connection wire raised from the connection portion is not less than 0.00025 mm$^2$.

4. The method according to claim 3, further comprising the steps of:
   preparing a capillary including an insertion hole for inserting the connection wire thereinto and a pressure end surface for pressing the connection wire inserted into the insertion hole, wherein the planar shape of the pressure end surface is non-circular in that the length in the arranging direction of the individual electrodes or the IC-electrode pads is shorter than that in a direction perpendicular thereto; and
   bonding the connection wire to the individual electrodes or the IC-electrode pads by pressing the connection wire inserted into the insertion hole of the capillary and placed on the individual electrodes or the IC-electrode pads with the pressure end surface while ultrasonic vibration is applied to the pressed connection wire.

5. The method according to claim 4, wherein both respective ends of the pressure end surface in a direction perpendicular to the arranging direction of the exothermic bodies have a curved surface with a curvature ranging from 0.03 mm to 0.05 mm.

6. The method according to claim 3, further comprising the steps of:
   preparing a capillary including an insertion hole for inserting the connection wire thereinto and a pressure end surface for pressing the connection wire inserted into the insertion hole; and
   bonding the connection wire to the individual electrodes or the IC-electrode pads by pressing the connection wire inserted into the insertion hole of the capillary and placed on the individual electrodes or the IC-electrode pads with the pressure end surface so as to move the capillary in a direction perpendicular to the arranging direction of the individual electrodes or the IC-electrode pads while ultrasonic vibration is applied to the pressed connection wire.

7. The method according to claim 3, further comprising the steps of:
   forming an Au pad layer with a surface area of not less than 0.002 mm$^2$ on the individual electrodes or the IC-electrode pads; and
   bonding one end of the connection wire on the Au pad layer.

* * * * *